United States Patent
Deppisch et al.

(10) Patent No.: US 9,758,855 B2
(45) Date of Patent: Sep. 12, 2017

(54) CLOSED LOOP CONTROL

(75) Inventors: Thomas Deppisch, Aschaffenburg (DE); Franz-Josef Helle, Rodenbach (DE); Manfred Englert, Erlensee (DE); Uwe Hermanns, Karlstein am Main (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 420 days.

(21) Appl. No.: 14/357,168

(22) PCT Filed: Nov. 30, 2011

(86) PCT No.: PCT/EP2011/071425
§ 371 (c)(1),
(2), (4) Date: Feb. 20, 2015

(87) PCT Pub. No.: WO2013/079108
PCT Pub. Date: Jun. 6, 2013

(65) Prior Publication Data
US 2015/0152542 A1    Jun. 4, 2015

(51) Int. Cl.
C23C 14/34    (2006.01)
C23C 14/00    (2006.01)
C23C 14/56    (2006.01)
H01J 37/32    (2006.01)
H01J 37/34    (2006.01)

(52) U.S. Cl.
CPC ...... *C23C 14/0042* (2013.01); *C23C 14/0036* (2013.01); *C23C 14/0094* (2013.01); *C23C 14/56* (2013.01); *C23C 14/562* (2013.01); *H01J 37/32935* (2013.01); *H01J 37/34* (2013.01); *H01J 2237/332* (2013.01)

(58) Field of Classification Search
CPC .. C23C 14/54; C23C 14/0042; C23C 14/0036
See application file for complete search history.

(56) References Cited

U.S. PATENT DOCUMENTS

| | | | |
|---|---|---|---|
| 4,201,645 A | 5/1980 | Riegert | |
| 5,556,520 A | 9/1996 | Latz | |
| 6,537,428 B1* | 3/2003 | Xiong | C23C 14/0036 204/192.13 |

FOREIGN PATENT DOCUMENTS

EP    1553206    7/2005

OTHER PUBLICATIONS

International Search Report and Written Opinion for Application No. PCT/EP2011/071425 dated Oct. 15, 2012.

* cited by examiner

*Primary Examiner* — Jason M Berman
(74) *Attorney, Agent, or Firm* — Patterson + Sheridan LLP (57) ABSTRACT

A method of controlling a reactive deposition process and a corresponding assembly and/or apparatus are described. The method includes providing power to a cathode with a power supply, providing a voltage set point to the power supply, receiving a power value correlating the power provided to the cathode, and controlling a flow of a process gas in dependence of the power value to provide a closed loop control for the power value.

17 Claims, 5 Drawing Sheets

CLOSED LOOP CONTROL

TECHNICAL FIELD OF THE INVENTION

Embodiments of the present invention relate to assemblies for control of reactive deposition processes, apparatuses including such assemblies and methods of controlling reactive deposition processes. Embodiments of the present invention particularly relate to a closed loop controlled assembly for a reactive deposition process, a deposition apparatus including a closed loop controlled apparatus for a reactive deposition process and a method of controlling a reactive deposition process.

BACKGROUND OF THE INVENTION

In many applications, it is necessary to deposit thin layers on a substrate, e.g. a flexible substrate. Typically, the flexible substrates are coated in different chambers of a flexible substrate coating apparatus. Further, a stock of a flexible substrate, for example, a roll of a flexible substrate, may be disposed in one chamber of the substrate coating apparatus. Typically, the flexible substrates are coated in a vacuum, using a vapor deposition technique, for example, physical vapor deposition or chemical vapor deposition.

Particularly for flexible substrates but also for other substrates, the deposition rate of a deposition process is of relevance, because deposition on flexible substrates is often conducted whilst the flexible substrate is fast moving. For example, in packaging industry, layers like Al2O3, SiO2 or other layers, which can be deposited by a reactive deposition process, can be used for coating packaging.

For example, SiO2 can be sputtered in oxygen mode but in this mode the deposition rate is low. In metallic mode an absorbing SiOx layer is deposited. Therefore, it is most efficient to run the SiO2 process in transition mode. In this mode it is possible to deposit transparent SiO2 with high rate. To keep the cathode in the transition mode special monitoring features like PEM (plasma emission monitoring) or lambda sensors can be used in combination with a special control routine. This needs extra hard- and software and is therefore an expensive solution. Accordingly, a fast and reliable reactive deposition process is required, which is simpler to implement.

SUMMARY OF THE INVENTION

In light of the above, a method of controlling a reactive deposition process, a closed loop control assembly configured for a reactive deposition process, and a deposition apparatus for reactive deposition of a layer on a substrate are provided. Further aspects, advantages, and features of the present invention are apparent from the dependent claims, the description, and the accompanying drawings.

According to one embodiment, a method of controlling a reactive deposition process is provided. The method includes providing power to a cathode with a power supply, providing a voltage set point to the power supply, receiving a power value correlating the power provided to the cathode, and controlling a flow of a process gas in dependence of the power value to provide a closed loop control.

According to another embodiment, closed loop control assembly is provided. The closed loop control assembly is configured for a reactive deposition process in deposition apparatus having a chamber and a cathode therein. The closed loop control assembly includes a power supply connected to the cathode for providing power to the cathode, a gas supply configured for providing a process gas in the chamber, a controller connected to the power supply for providing a voltage set point to the power supply and for receiving a power value from the power supply, wherein the controller is further connected to the gas supply for controlling a gas flow of the process gas in dependence of the power value.

According to a further embodiment, a deposition apparatus for reactive deposition of a layer on a substrate is provided. The apparatus includes a chamber for depositing the layer on the substrate therein, a cathode for generating a plasma in the chamber, and a closed loop control assembly. The closed loop control assembly includes a power supply connected to the cathode for providing power to the cathode, a gas supply configured for providing a process gas in the chamber, a controller connected to the power supply for providing a voltage set point to the power supply and for receiving a power value from the power supply, wherein the controller is further connected to the gas supply for controlling a gas flow of the process gas in dependence of the power value.

Embodiments are also directed at apparatuses for carrying out the disclosed methods and include apparatus parts for performing each described method step. These method steps may be performed by way of hardware components, a computer programmed by appropriate software, by any combination of the two or in any other manner. Furthermore, embodiments according to the invention are also directed at methods by which the described apparatus operates. It includes method steps for carrying out every function of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following.

DETAILED DESCRIPTION OF EMBODIMENTS

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

Embodiments described herein refer inter alia to a substrate processing system adapted for processing a flexible substrate such as a web for packaging, for flexible photovoltaic devices or other applications. In particular, the substrate processing system is adapted for a continuous processing of a flexible substrate such as a web unwound from an unwinding module.

It is noted here that a flexible substrate or web as used within the embodiments described herein can typically be characterized in that it is bendable. The term "web" may be synonymously used to the term "strip" or the term "flexible substrate". For example, the web as described in embodiments herein may be a foil.

However, even though high deposition rates with a simply process control can be considered particularly beneficial for deposition processes for fast moving flexible substrates, other reactive deposition processes can also benefit from the embodiments described herein, since fast and well controlled deposition increases the throughput and/or yield and, thus, the cost of ownership of a deposition apparatus.

According to embodiments described herein, a closed loop control for a reactive deposition process is provided. Thereby, typically for a reactive deposition process with hysteresis, a fast and reliable process control mode can be provided with simplified apparatus requirements. For example, the closed loop control described herein does not need the plasma monitor, a lambda-sensor, or the like.

Figure 1:
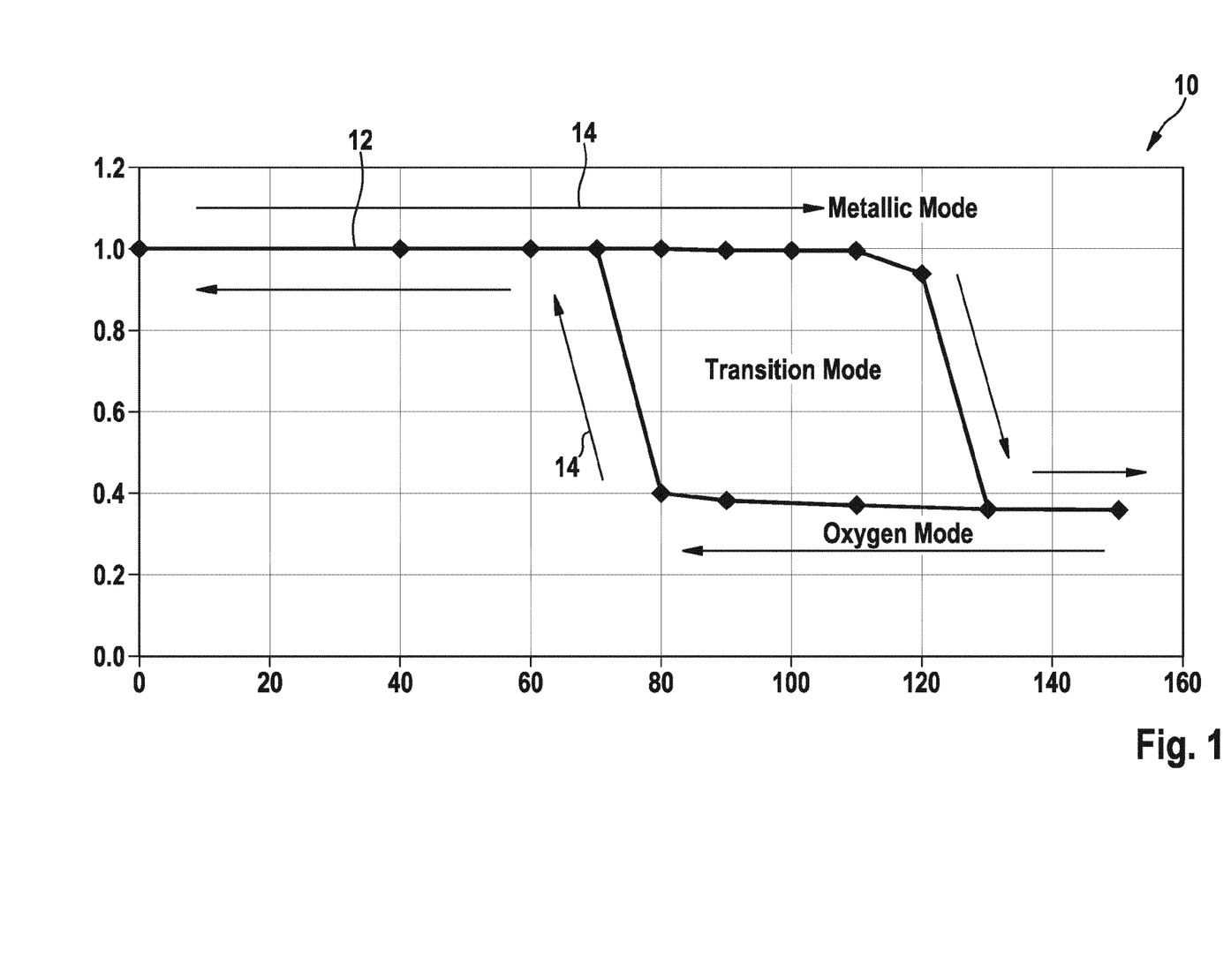
FIG. 1 show a graph illustrating a hysteresis curve of a typical reactive deposition process.

FIG. 1 illustrates a graph 10 showing a hysteresis curve of a typical reactive deposition process. This can, for example, be deposition of silicon oxide (SiO2), wherein silicon is sputtered from a cathode while oxygen is provided in the plasma. Thereby, silicon oxide can be deposited on the substrate. The curve 12 shown in FIG. 1 shows the deposition parameters such as the voltage provided to the sputter cathode as a function of the flow of a process gas, such as oxygen. However, a similar hysteresis curve can also be seen for other deposition parameters such as the oxygen content in the plasma, which can for example be measured with a lambda-sensor. Accordingly, the values provided in graph 10 are shown as normalized values.

As indicated by the arrows 14 shown in FIG. 1, curve 12 shows a hysteresis. For a low process gas flow a comparably high cathode voltage is provided and the deposition process is conducted in a metallic mode. Even though a high deposition rate can be provided in the metallic mode, and absorbing layer is deposited, which is not appropriate for a plurality of applications. For higher process gas flow rates the deposition process turns into an oxygen mode where transparent silicon oxide layer can be deposited. Yet, the deposition rate is comparably low. Accordingly, methods of controlling the reactive deposition process as described herein typically control the deposition process to be provided in a transition mode, where a transparent layer, such as silicon oxide, can be deposited at the comparably high rate.

Control modes, such as current control modes using an oxygen sensor (lambda-sensor) or a plasma monitoring (PEM) require additional hardware for the sensor equipment and control units with fast logic controls to keep the deposition process stable in the transition mode. Signals from such sensors providing information of a plasma characteristic can be fed to fast logic controllers in order to control the power supply or the gas supply. Accordingly, in order to keep the cathode power controlled in the transition mode in the past special monitoring features like PEM or lambda sensors were used in combination with a special control routine. This needs extra hard- and software and is therefore an expensive solution. Further, current control modes are not necessarily beneficial.

Embodiments described herein provide a closed loop control for the reactive deposition process, wherein the cathode can be power controlled. Thereby, the deposition rate can be constant as the deposition rate is proportional to the power provided to the cathode.

Embodiments described herein, include a voltage supply or a generator that can keep the cathode in transition mode by using a voltage control or an upper voltage limitation. However, when providing a voltage control to the power supply, the voltage supply results in being voltage controlled and the power is not kept constant, because the power supply can only keep one parameter fixed. If a voltage control is used, the power and therefore the deposition rate is changing with the used process gases (or degassing) and this is not always acceptable. Also a manual deposition rate adjustment is needed if the power supply is operated in voltage mode.

Accordingly, embodiments described herein provide, in addition to the voltage control of the power supply, a power control as a closed control loop, wherein the actual power is monitored and the flow rate of a process gas is controlled to keep the power essentially constant. Thereby, a closed loop control providing an essentially constant deposition rate can be provided. According to embodiments described herein, the reactive deposition process, such as a $SiO_2$ process, is voltage controlled or voltage limited and establishes an $O_2$ flow regulation which keeps the sputter power constant. Thereby, a closed loop control is provided.

Even though the examples referred to herein mainly refer to $SiO_2$ deposition, the methods of controlling a reactive deposition process, the closed loop control assemblies configured for a reactive deposition process, and the deposition apparatuses for reactive deposition of a layer on a substrate can be utilized for other reactive deposition processes such as depositing $Al_2O_3$, $TiO_2$, $ZnO$, $Nb_2O_5$, $SnO_2$, $Si_3N_4$ or the like.

Figure 2:
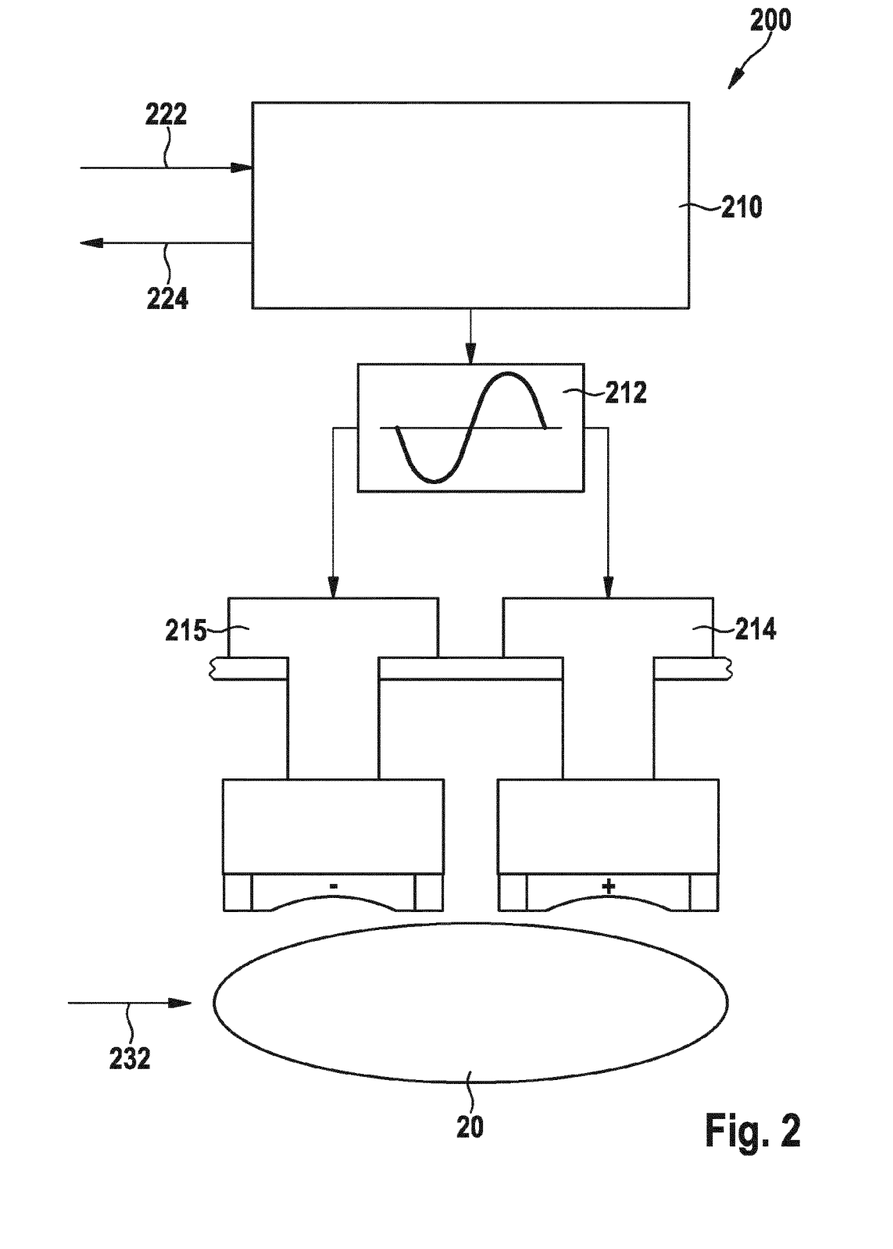
FIG. 2 shows a schematic view of a control assembly for a closed loop control for a reactive deposition process according to embodiments described herein.

FIG. 2 shows a closed loop control assembly 200 for illustrating embodiments described herein. The control assembly includes a power supply 210. As indicated by reference numeral 212, the power supply can typically be an AC power supply, such as the middle frequency power supply. According to some embodiments, which can be combined with other embodiments described herein, the oscillating frequency of the power supply can be 1 kHz to 200 kHz. The power supply 210 is connected to a cathode assembly.

As shown in FIG. 2, the cathode assembly can include a first cathode 214 and the second cathode 215. Thereby, power is provided to a cathode or a cathode assembly, respectively. According to some embodiments, which can be combined with other embodiments described herein, the AC power can be provided to the cathode 214 and the cathode 215 in an alternating manner such that one cathode provides a counter electrode (anode) for the other cathode, respectively, during a half cycle of the AC waveform. By powering the cathode assembly the plasma 20 is generated.

According to some embodiments, which can be combined with other embodiments described herein, the power supply 210 can include DC generator and an AC oscillator, such as the middle frequency oscillator. The DC generator has a DC power, a DC voltage, and a DC current as output for the oscillator. The oscillator has an output power, an output voltage, an output current, and an output frequency provided to the cathode or cathode assembly, respectively. As indicated by arrow 222 the power supply receives a voltage set point signal from a controller. Further, the power supply provides a power value to the controller as indicated by arrow 224. Thereby, typically the power value is the actual AC power, which is provided by the power supply or the oscillator, respectively, to the cathode.

As indicated by arrow 232 a process gas is provided in the plasma region of the plasma 20. According to typical embodiments, which can be combined with other embodiments described herein, the process gas can include at least one of argon, oxygen, nitrogen, $H_2$, $H_2O$, and $N_2O$. Typically, oxygen can be provided as a reactive gas for the reactive deposition process. Providing a small amount of nitrogen in the process gas for an oxygen-based reactive process can be beneficial for stabilizing the generated plasma 20.

According to typical embodiments, the voltage set point value 222 provided as an upper limit for the voltage, which the power supply 210 can provide to the cathode. With respect to FIG. 1, the upper limit can for example have a normalized value of 0.6 to 0.8, for example 0.7. Thereby, in the process starting from a metallic mode, the voltage can be adjusted to deposit the layer in that transition mode, for example the right hysteresis portion of curve 12 in FIG. 1.

Accordingly, the voltage set point value 222 can be set as the limit to keep that deposition process in transition mode. The power provided by the power supply thereby depends on the flow of reactive gas in the plasma region 20. For example, for a silicon oxide deposition process, the power can depend on the oxygen flow while being limited by the voltage set point value. The actual power is provided as a signal to a controller as indicated by arrow 224. The controller, which provides the closed loop control, controls the process gas flow indicated by arrow 232 in dependence of the actual power, which is provided to the cathode.

Thus, according to some embodiments described herein, the voltage of the power supply is fixed by the set point value and the output power of the power supply 210 is controlled by a controller by means of adjusting the process gas flow. According to some embodiments, which can be combined with other embodiments described herein, the controller can be a programmable logic controller (PLC). As the process gas flow, for example the oxygen flow, is adjusted to keep the output power and, thereby, the deposition rate constant, constant deposition rate can be provided in transition mode without having additional hardware like lambda-sensors or plasma monitoring (PEM).

Figure 3:
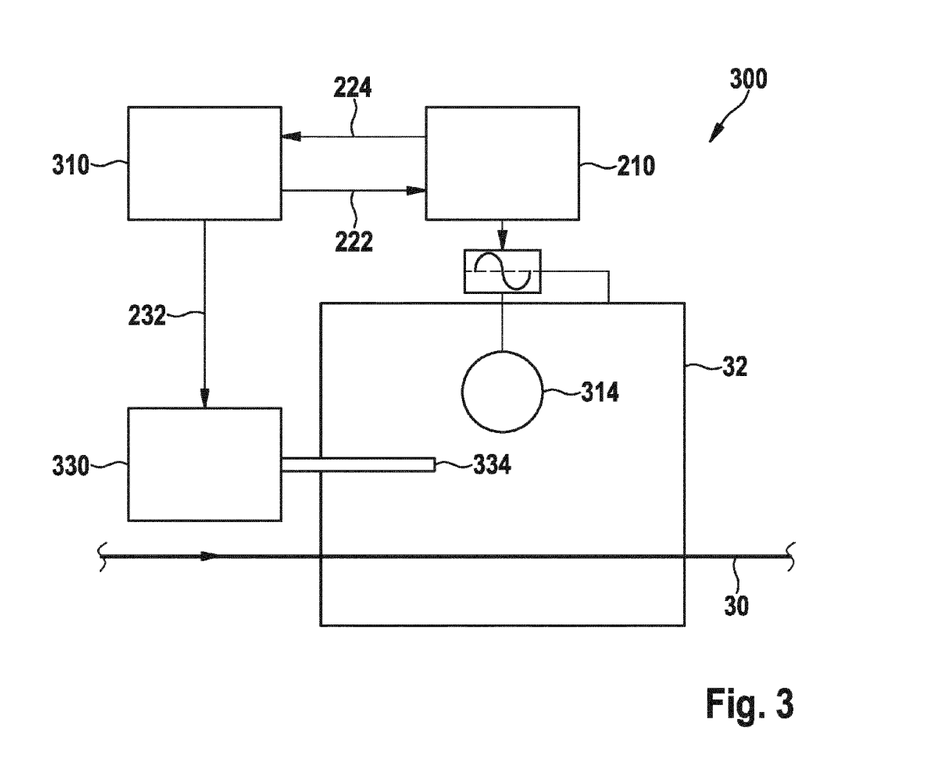
FIG. 3 shows a schematic view of a deposition apparatus having a closed loop control assembly according to embodiments described herein.

FIG. 3 illustrates a deposition apparatus 300 including the closed loop control assembly. The deposition apparatus 300 shown in FIG. 3 includes a power supply 210. The AC power supply is connected to the rotatable cathode 314 and the chamber 32 of the deposition apparatus 300.

According to different embodiments, which can be combined with other embodiments described herein, the AC power supply can be connected to one cathode and a counter electrode provided by the housing, by another part of the deposition apparatus, or by another electrode. For example, the other electrode can be provided on the side of the substrate opposing the cathode 314. According to yet further options, a cathode assembly with two cathodes can be provided, wherein the AC power supply is connected to the first and the second cathode in order to provide a twin-cathode-assembly which is driven by an alternating power. Typically, middle frequency power is applied.

Figure 5:
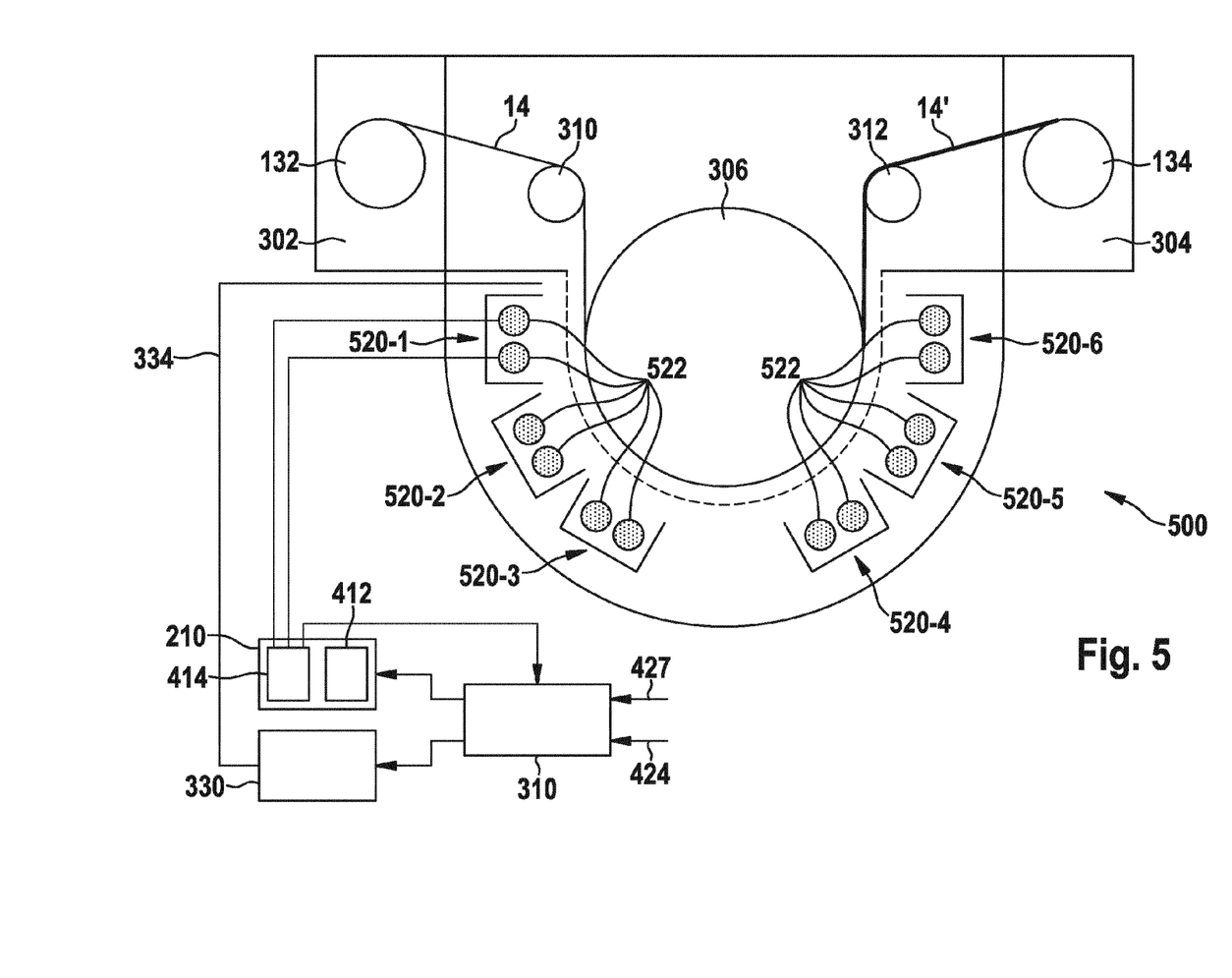
FIG. 5 shows a schematic view of a further deposition apparatus having a closed loop control assembly according to embodiments described herein.

According to typical embodiments, the cathodes can be magnetron sputtering cathodes. Further, planar cathodes as shown in FIG. 2 or rotational cathodes as shown in FIGS. 3 and 5 can be utilized for the reactive deposition process as described herein, the respective control assemblies and deposition apparatuses.

As will be understood, the cathodes 214, 215 and 314, as well as the other cathode referred to herein can be either a cathode or an anode when AC power is supplied. However, the sputtering targets are referred to as cathodes even though there function can be the function of an anode during a half cycle of the AC frequency waveform.

As shown in FIG. 3, the voltage set point 222 is provided by the controller 310 and the controller 310 receives the power value, which is typically the actually provided MF power which is output to the cathode 314. The controller 310 provides the signal 232 to the gas supply 310 including a gas conduit 334 for providing process gas in the chamber 32. The substrate 30 is transported through the chamber 32 for reactive deposition of the layer, for example, silicon oxide, aluminum oxide, $TiO_2$, ZnO, $Nb_2O_5$, $SnO_2$, $Si_3N_4$ or the like.

The gas flow rate provided by conduit 334 in the plasma region in the chamber 32 is proportional to the output power of the power supply 210 provided to the cathode 314. The controller 310 controls the gas flow rate such that the actual power value 224, which is provided as a signal from the power supply to the controller 310, is essentially constant. Thereby a closed loop control is established.

Figure 4:
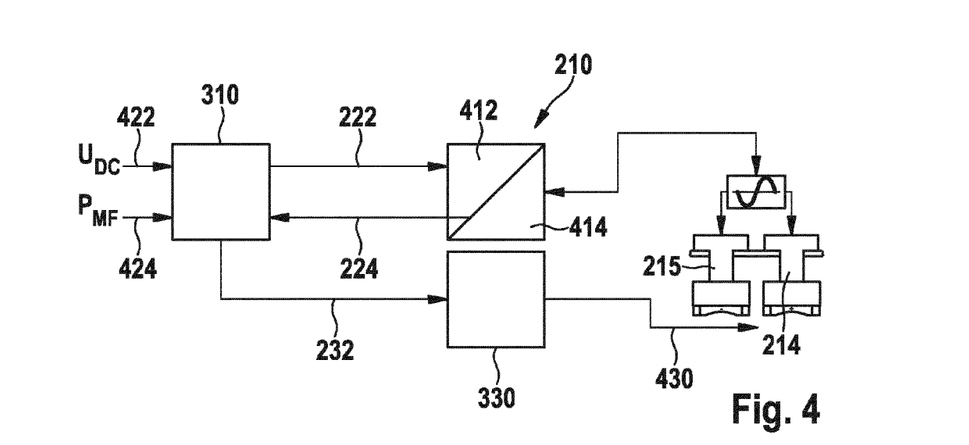
FIG. 4 shows a schematic view of a control assembly for a closed loop control for a reactive deposition process according to embodiments described herein and illustrating parameters to be used for control of the reactive deposition process.

FIG. 4 illustrates yet another embodiment of a closed loop control assembly for powering cathodes 214 and 215. The closed loop control and the method of operating the closed loop control is described with respect to FIGS. 4 and 6. As indicated by arrows 422 and 424 a set point voltage and a set point power can be provided to the controller 310. This can for example be done through the graphical user interface by an operator. Typically, the set point voltage can be a DC voltage and the set point power can be the middle frequency power. However, the set point voltage can also be the middle frequency voltage and the set point power might also be a DC power, which is outputted from a DC generator to oscillator in the power supply. The controller 310 provides the set point voltage as indicated by arrow 222 to the power supply 210.

Typically, the power supply 210 can include a DC generator 412 and an AC oscillator, for example, a middle frequency oscillator 414. The power supply 210 is configured for using the voltage set point 222 as the desired output voltage, particularly as an upper voltage limit of the voltage provided by the power supply 210. For example, if the set point voltage is a DC voltage, the power supply 210 can use the set point as an upper limit of the DC voltage provided by the DC generator 412 to the oscillator 414. For example, if the set point voltage is a MF voltage, the power supply 210 can use the set point as an upper limit of the MF voltage provided by the oscillator 414 to the cathodes. Thereby, the power supply is operated voltage controlled as shown in step 602 in FIG. 6.

According to typical embodiments described herein, the voltage set point 422 is provided such that the deposition process is conducted in transition mode. Thereby, due to the upper voltage limit, the transition mode can be stabilized and the actual AC power provided by the oscillator 414 to the cathodes 214 and 215 depends on the process gas available in the plasma region. The actual power provided to the cathodes 214 and 215 is provided as a signal 224 from, for example, the oscillator to the controller 310. This corresponds to step 604 in FIG. 6 where the actual power Pact is received. The controller compares the actual power Pact to the set point power 424 in step 606. As shown in step 608 the gas flow of the process gas, and particularly that gas flow of the reactive gas being included in the process gas, is adjusted. This is indicated by arrow 232 in FIG. 4. For example, if the actual power is smaller than the set point power, e.g. the oxygen flow for a silicon oxide deposition process is increased. If the actual power is larger than the set point power, e.g. the oxygen flow for a silicon oxide deposition process will be decreased. Similar controls can be implemented for other reactive deposition processes and the corresponding reactive process gases.

According to typical embodiments, the oxygen flow can be adjusted within certain limits and can be adjusted by a predetermined increment. As indicated by the arrow from step 608 to step 604, the closed loop control is implemented to provide an essentially constant power. Thereby, an essentially constant deposition rate is provided in the transition mode, which is set by the voltage control of the power supply.

Figure 6:
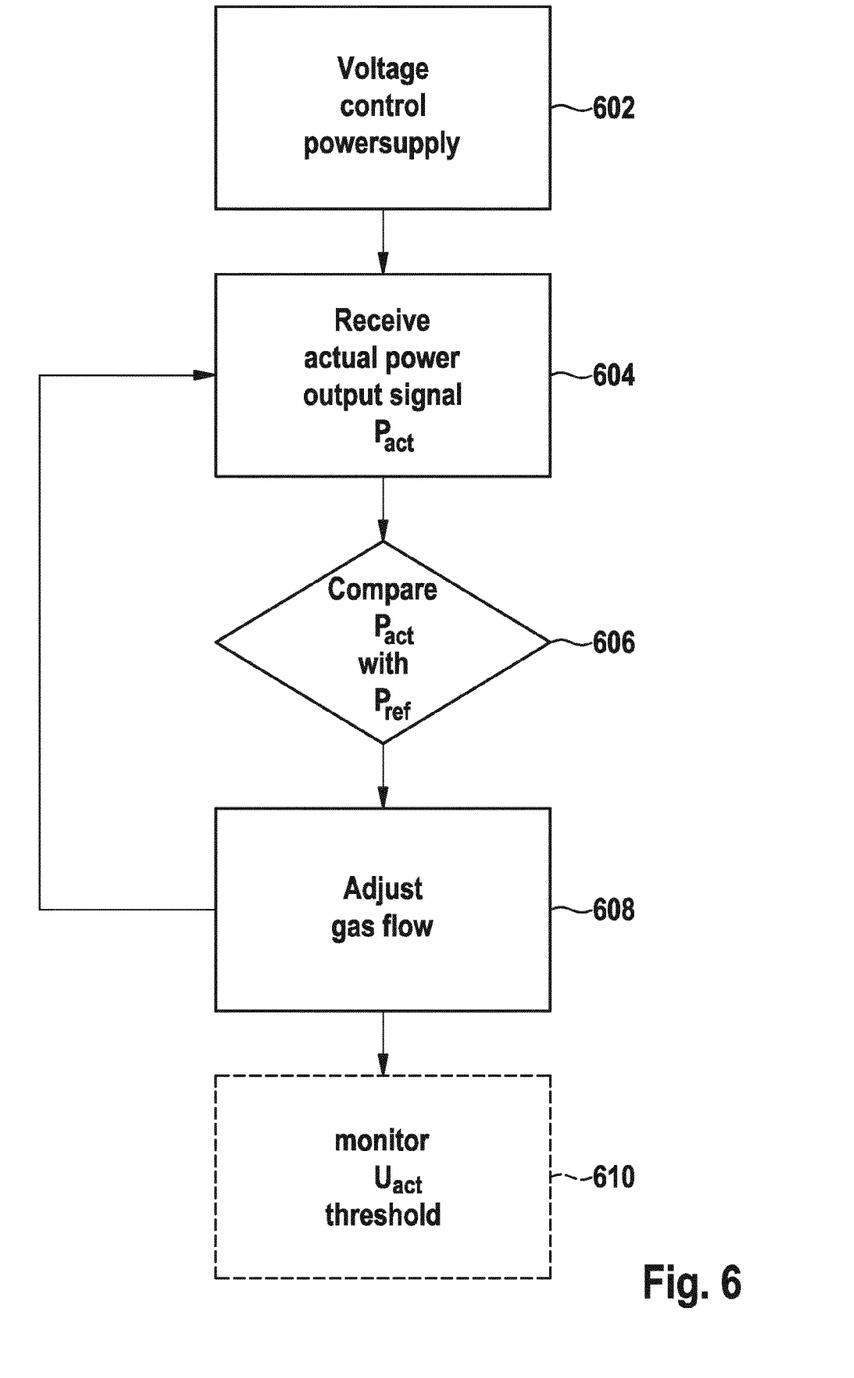
FIG. 6 shows a flow chart illustrating methods of closed loop control of a reactive deposition process according to embodiments described herein.

FIG. 6 illustrates a further step 610, which can be provided according to some optional modifications of embodiments described herein. Thereby, in addition to the actual power 224, which is provided as a signal from the power supply 210 to the controller 310 also the actual voltage is provided as a signal from the power supply 210 to the controller 310. In step 610 the actual voltage is monitored. If the actual voltage drops below the lower limit, oxygen mode is detected. This can be understood with respect to FIG. 1. If the normalized voltage would drop to the value of below 0.4, the reactive deposition process would be in the oxygen mode as shown in FIG. 1. According to some embodiments, the oxygen flow rate can be set to the minimum oxygen set point level in order to return via the metallic mode in the transition mode for the deposition process.

FIG. 5 schematically illustrates an example of a deposition apparatus 500 for reactive deposition of a layer on a substrate, e.g. a flexible substrate, according to embodiments herein.

According to typical embodiments, the deposition apparatus 500 may include an unwind roller 132 and a rewind roller 134 for unwinding of substrate 14 prior to deposition and winding of substrate 14. Deposition apparatus 500 may include a roller system (not shown) for translation of substrate 14 through the different processing chambers. In particular, a deposition apparatus according to embodiments herein may be constituted as a sputter roll coater for roll-to-roll deposition on a plastic film.

The processing module of apparatus 500 can further include rollers 310, 312 for appropriately feeding a substrate 14 to processing drum 306, and facilitating feeding of a processed substrate 14' from process module to winding module 304. Deposition apparatus 500 may be a Smart-Web™, manufactured by Applied Materials, adapted for manufacturing a transparent body according to embodiments of the present disclosure. Examples of a roll-to-roll deposition apparatus, which could be adapted according to embodiments herein, are described in European patent application Appl. No. EP20040003574, entitled "Strip coating installation with a vacuum chamber and a coating cylinder" filed Feb. 18, 2004 and published under publication number EP 1 561 837 A1, which is incorporated herein by reference to the extent the application is not inconsistent with this disclosure.

The exemplarily apparatus shown in FIG. 5 includes a first deposition assembly having five target assemblies 520-1 to 520-6 and configured to deposit a layer or layer stack over a substrate 14. According to typical embodiments, each several layers of a layer stack can deposited in an individual deposition chamber or individual compartments of a deposition chamber. Alternatively, each compartment can be used to deposit further material of the same layer.

According to some embodiments, which can be combined with other embodiments described herein, the apparatus 500 can include 6 compartments, chambers or sub-chambers, such that each compartment can be operated under individual processing parameters, particularly with individual processing gases. As shown in FIG. 5, the apparatus can include six rotatable MF cathodes or target assemblies 520-1 to 520-6 equipped with Si targets, e.g. sprayed Si target tubes 522. For ease of reference, the controller 310, the power supply 219 having e.g. a DC generator 412 and an MF oscillator 414, the gas supply 330, and the gas conduit 334 are only shown for the first target assembly 520-1.

According to typical embodiments, power supplies and gas supplies can be provided for each of the compartments of the deposition apparatus and a controller 310 can be used to control deposition in each department. Alternatively, a controller such as PLC, can be provided for each deposition process. Thereby, typically, a common user interface can be provided to provide set point voltages and set point powers for each deposition zone. According to yet further alternative modifications, similar set point voltages and set point powers can be provided for two or more, or even all deposition zones.

According to some embodiments described herein, particularly for deposition of layer stacks including different layer, one or a few of the deposition assemblies 520-1 to 520-6 can be provided for a reactive deposition process and with a closed loop control assembly according to embodiments described herein.

For example, a three-layer transparent layer stack having three silicon-containing dielectric films ($SiO_2$ or $Si_3N_4$) can be manufactured with the closed loop control according to embodiments described herein. Thereby, a lambda-sensor or PEM can be avoided for one or more of the deposition compartments.

According to yet further embodiments, the apparatus 500 shown in FIG. 5 and having 6 compartments, target assemblies or cathodes, can also be further scaled up, e.g. to 8 10 or even 12 compartments, target assemblies or cathodes. Typically, at least the throughput can be further increased by such an up scaling, because the layer limiting the speed of the substrate based upon layer thickness and/or deposition rate can be deposited with an additional cathode.

As indicated exemplarily for cathode assembly 520-1, a set point voltage 422 and a set point power 424 can be provided to the controller 310. The controller 310 provides the set point voltage to the power supply 210. Typically, the power supply 210 can include a DC generator 412 and an AC oscillator, for example, a middle frequency oscillator 414. The power supply is operated voltage controlled such that the deposition process is conducted in transition mode. Thereby, due to the upper voltage limit, the transition mode can be stabilized and the actual AC power provided by the oscillator 414 to the cathodes 214 and 215 depends on the process gas available provided by gas supply 330 to conduit 334. The actual power provided to the cathodes 522 is provided as a signal to the controller 310. The gas flow of the process gas is adjusted in dependence of the actual power.

As described above, according to some embodiments, which can be combined with other embodiments described herein, the MF Generator is $P_{MF}$-controlled, or $U_{MF}$ controlled. The power control of the generator or the process as such can be utilized by the closed loop control of the flow rate of the process gas as the voltage limit is typically not reached. A $P_{MF}$ set point provided to the power supply can be set about 10% higher than the requested process $P_{MF\text{-}Set}$ set point. The $U_{DC/MF}$ limit set point will be changed to the process required set point $U_{DC/MF\text{-}Set}$.

The Oxygen Flow will be changed depending on the difference of the requested MF-Power (PMF-Set) and actual MF-Power (PMF-Act). If PMF-Act is smaller than PMF-Set the gas flow, e.g. the oxygen flow, is increased. If PMF-Act is larger than PMF-Set gas flow, e.g. the oxygen flow, is decreased.

The gas flow, e.g. the oxygen flow, can be changed within limits (FlowMinLimit and FlowMaxLimit) by deltaFlow per min.

Additional to the MF-Power Control by changing the gas flow rate, the actual voltage (UDC/MF-Act) should typically be close by the set point Voltage (UDC/MF-Set). If the actual voltage gets below a threshold limit oxygen mode deposition is detected and counter-measures can be provided as described above.

According to embodiments described herein, with the closed loop control assembly, the apparatus including the closed loop control assembly and the method of reactive layer deposition as described herein, there is no need for additional hardware like PEM or lambda sensors. Yet, a stable deposition rate in transition mode, i.e. with sufficient deposition rate, can be provided.

The written description uses examples to disclose the invention, including the best mode, and to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the examples of embodiments and embodiments or modifications thereof described above may be combined with each other.

The patentable scope of the invention is defined by the claims, and may include other examples that occur to those skilled in the art. Such other examples are intended to be within the scope of the claims.

While the foregoing is directed to embodiments of the invention, other and further embodiments of the invention may be devised without departing from the basic scope thereof, and the scope thereof is determined by the claims that follow.

The invention claimed is:

1. A method of controlling a reactive deposition process, comprising:
   providing power to a cathode with a power supply;
   providing a voltage set point to the power supply;
   receiving a power value of the actual power provided to the cathode from the power supply; and
   controlling a flow of a process gas based on the power value to provide a closed loop control.

2. The method according to claim 1, wherein the power provided to the cathode is MF power.

3. The method according to claim 1, wherein the voltage set point is an upper limit for the power supply.

4. The method according to claim 1, wherein the voltage set point is configured to operate the cathode in a transition mode.

5. The method according to claim 1, wherein the received power value is stabilized by controlling the flow of process gas.

6. The method according to claim 1, wherein the process gas comprises oxygen.

7. The method according to claim 1, further comprising:
   receiving an actual voltage value of the voltage provided by the power supply and monitoring a deposition mode based upon the actual value.

8. A closed loop control assembly configured for a reactive deposition process in a deposition apparatus having a chamber and a cathode therein, comprising:
   a power supply connected to the cathode for providing power to the cathode;
   a gas supply configured for providing a process gas into the chamber; and
   a controller connected to the power supply for providing a voltage set point to the power supply and for receiving a power value of the actual power provided to the cathode from the power supply, wherein the controller is further connected to the gas supply for controlling a gas flow of the process gas based on the power value.

9. The assembly according to claim 8, wherein the power supply is a MF power supply.

10. The assembly according to claim 8, wherein the power supply is configured to provide the power with an oscillation frequency of 1 kHz to 200 kHz.

11. The assembly according to claim 8, wherein the controller contains a program code adapted for controlling the flow of the process gas based on the power value to provide a closed loop control.

12. The assembly according to claim 11, wherein the voltage set point is an upper voltage limit.

13. A deposition apparatus for reactive deposition of a layer on a substrate comprising:
   a chamber for depositing the layer on the substrate therein;
   a cathode for generating a plasma in the chamber; and
   a closed loop control assembly configured for a reactive deposition process in a deposition apparatus having the chamber and the cathode therein, the closed loop assembly comprising:
   a power supply connected to the cathode for providing power to the cathode;
   a gas supply configured for providing a process gas into the chamber; and
   a controller connected to the power supply for providing a voltage set point to the power supply and for receiving a power value of the actual power provided to the cathode from the power supply, wherein the controller is further connected to the gas supply for controlling a gas flow of the process gas based on the power value.

14. The method according to claim 1, wherein the power provided to the cathode is MF power with an oscillation frequency of 1 kHz to 200 kHz.

15. The method according to claim 4, wherein the voltage set point is configured to operate the cathode in a transition mode.

16. The method according to claim 1, wherein the process gas comprises oxygen, wherein the oxygen flow is controlled.

17. The assembly according to claim 11, wherein the power supply is a MF power supply having a DC generator and an oscillator.

\* \* \* \* \*